United States Patent [19]
Hoenk et al.

[11] Patent Number: 5,376,810
[45] Date of Patent: Dec. 27, 1994

[54] GROWTH OF DELTA-DOPED LAYERS ON SILICON CCD/S FOR ENHANCED ULTRAVIOLET RESPONSE

[75] Inventors: Michael E. Hoenk, Pasadena; Paula J. Grunthaner; Frank J. Grunthaner, both of Glendale; Robert W. Terhune, Pasadena; Michael H. Hecht, Los Angeles, all of Calif.

[73] Assignee: California Institute of Technology, Pasadena, Calif.

[21] Appl. No.: 173,133

[22] Filed: Dec. 21, 1993

Related U.S. Application Data

[63] Continuation of Ser. No. 905,012, Jun. 26, 1992, abandoned.

[51] Int. Cl.$^5$ .................. H01L 29/796; H01L 27/14; H01L 31/00
[52] U.S. Cl. ............................... 257/228; 257/229; 257/657; 437/105
[58] Field of Search ............... 257/228, 436, 447, 460, 257/655, 657, 223, 229

[56] References Cited

U.S. PATENT DOCUMENTS

| | | | |
|---|---|---|---|
| 4,197,553 | 4/1980 | Finnila et al. | 257/228 |
| 4,198,646 | 4/1980 | Alexander et al. | 257/258 |
| 4,213,137 | 7/1980 | Pines | 257/228 |
| 4,313,127 | 1/1982 | Su et al. | 257/228 |
| 4,594,605 | 6/1986 | Kramer | 257/447 |
| 4,798,958 | 1/1989 | Janesick et al. | 257/228 |
| 4,822,748 | 4/1989 | Janesick | 257/228 |
| 4,882,609 | 11/1989 | Schubert et al. | 257/657 |

OTHER PUBLICATIONS

Janesick et al., "Charge Coupled Device Pinning Technologies," SPIE vol. 1071 Optical Sensors and Electronic Photography (1989) pp. 153–169.
Janesick et al., "History and Advancements of Large Area Array Scientific CCD Imagers," Astronomical Society of America, Pacific Conference Series 1991, Tucson, Ariz.
P. J. Grunthaner et al., "Hydrogen Terminated Silicon Substrates for Low Temperature Molecular Beam Epitaxy," *Thin Solid Films*, vol. 183 (1989) pp. 197–212.
H. Jorke et al., "Bornon Delta–Doping in Si and Si and $Si_{0.8}Ge_{0.2}$ Layers," Applied Physics Letters, vol. 57 No. 17, Oct. 22, 1990 pp. 1763–1765.
N. L. Mattey et al., "p-type delta doped layers in silicon: Structural and electronic properties," Applied Physics Letters, vol. 57, No. 16, Oct. 16, 1990, pp. 1648–1650.

*Primary Examiner*—Gene M. Munson
*Attorney, Agent, or Firm*—Robert M. Wallace; Michael L. Keller

[57] ABSTRACT

The backside surface potential well of a backside-illuminated CCD is confined to within about half a nanometer of the surface by using molecular beam epitaxy (MBE) to grow a delta-doped silicon layer on the back surface. Delta-doping in an MBE process is achieved by temporarily interrupting the evaporated silicon source during MBE growth without interrupting the evaporated p+ dopant source (e.g., boron). This produces an extremely sharp dopant profile in which the dopant is confined to only a few atomic layers, creating an electric field high enough to confine the backside surface potential well to within half a nanometer of the surface. Because the probability of UV-generated electrons being trapped by such a narrow potential well is low, the internal quantum efficiency of the CCD is nearly 100% throughout the UV wavelength range. Furthermore, the quantum efficiency is quite stable.

5 Claims, 4 Drawing Sheets

GROWTH OF DELTA-DOPED LAYERS ON SILICON CCD/S FOR ENHANCED ULTRAVIOLET RESPONSE

ORIGIN OF THE INVENTION

The invention described herein was made in the performance of work under a NASA contract, and is subject to the provisions of Public Law 96-517 (35 USC 202) in which the Contractor has elected to retain title.

This is a continuation of application Ser. No. 07/905,012 filed Jun. 26, 1992, now abandoned.

BACKGROUND OF THE INVENTION

1. Technical Field

The invention relates to the enhancement of the response of semiconductor imager devices, and specifically silicon charge coupled device (CCD) imaging chips, to ultraviolet and blue light.

2. Background Art

The intensive commercial development of imaging CCDs has strongly advanced the technology in the last several years, giving high yields, large area detectors, higher pixel counts, substantial increases in well depth, and a major reduction in dark current. Silicon-based scientific CCDs (of the type described in Janesick et al., "History and Advancements of Large Area Array Scientific CCD Images," *Astronomical Society of Pacific Conference Series*, 1991, Tucson, Ariz.) have also matured during this period, providing the astronomy community access to the unique characteristics of this device, which include larger pixel-to-pixel dynamic range (>10000:1), quantum efficiencies in the X-ray and visible wavelengths approaching 80%, and broad band spectral response from 10 Å to nearly 1 micron. Unfortunately, the absolute quantum efficiency (QE) of an untreated scientific CCD drops below $10^{-5}$ in the critically important wavelength region of 1000 Å to 3000 Å. This QE reduction is related to two primary issues: (i) the depth of photon absorption and electron-hole pair production in silicon at these wavelengths and (ii) the surface charge and unstable response inherent in an untreated backside-illuminated CCD. Dramatic improvements in performance have been demonstrated by modifying the CCD surface. Unfortunately, as will be discussed below, most of these improvements are unstable. What is needed is a modification providing the maximum ultraviolet quantum efficiency permitted by reflection limitations with long term device stability sufficient for space applications.

FIG. 1 illustrates a qualitative energy band diagram across the thickness of a backside-illuminated CCD imager substrate, and indicates the presence of a potential well at the back surface. The absorption depth problem is illustrated in FIG. 2, which gives the photon absorption depth versus incoming radiation wavelength for crystalline silicon. Note that the absorption depth drops to a minimum of 40 Å at a wavelength of about 2800 Å and is less than 600 Å over the range of wavelengths from 600 to 4000 Å. This short absorption depth means that electron-hole pair production is occurring within 500 Å of the silicon surface. Because of the charge in the native oxide of the CCD backside surface, these carriers are swept into the backside surface potential well of FIG. 1 and undergo recombination leading to carrier annihilation, so that they never reach the photosensitive elements of the CCD on the opposite face of the silicon chip. This, of course, greatly reduces the quantum efficiency of the device.

The relationship between ultraviolet quantum efficiency and the surface potential well can be understood by reference to the qualitative energy band diagram of FIG. 1. The CCD charge collection wells and transfer circuits are located on the right side of the diagram. In this device, the gate oxide, gate metal, interface defect density, and ion implanted channel structure are all carefully optimized using the comprehensive technology of silicon metal-oxide-semiconductor (MOS) processing. The device substrate has been chemically thinned to give an imaging structure which is less than 20 micrometers thick. Thinning of the CCD substrate or die is done chemically.

In the standard fabrication of a backside thinned CCD, a native oxide is permitted to form through long term exposure to the atmosphere. This oxide is nonuniform in thickness, composition and defect density, and generally exhibits a substantial positive fixed oxide charge. This charge leads to a bending of the conduction and valence bands near the surface, as illustrated on the left side of FIG. 2. This band bending gives rise to a potential well (generally termed the backside well) which traps electrons generated within the well. This potential well prevents the detection of photons absorbed within approximately 1000 Å of the backside surface. The thin native oxide is full of interface states or localized traps (with surface densities of $10^{11}$ to $10^{12}$ cm$^{-2}$) which lead to electron-hole recombination (carrier annihilation). Efforts to produce better oxide layers with stable and controlled charge densities on the CCDs are limited by the susceptibility of the CCD circuitry to destruction during high temperature processing.

The overall problem becomes apparent by comparing the absorption depth in crystalline silicon of ultraviolet photons (illustrated in FIG. 2 as being about 40 Å at a wavelength of 2800 Å) with the vertical extent (about 1000 Å) of the backside surface potential well of FIG. 1. According to FIG. 2, a large fraction of incident UV photons are absorbed within 100 Å of the surface, producing carriers within the backside potential well, while according to FIG. 1 virtually all such carriers are absorbed into the backside surface potential well, never to reach the CCD detector elements on the front side, leading to a quantum efficiency of virtually zero for UV photons.

A number of solutions have been demonstrated to alter the effect of the oxide charge, all of which are perturbations to the completed thinned device structure, as described in Janesick et al., "History and Advancements of Large Area Array Scientific CCD Imagers," *Astronomical Society of Pacific Conference Series*, 1991, Tucson, Ariz., and Janesick et al., "Charge Coupled Device Pinning Technologies," SPIE Vol. 1071—*Optical Sensors and Electronic Photography*, 1989, pp. 153–169. These broadly include the introduction of negative charge at the native oxide surface, implantation of a narrow p+ layer on the CCD backside, and the use of a chromophore to convert UV photons to visible photons. The approaches relying on negative charge added to the surface of the backside oxide to create an accumulation layer include UV charging, chemical charging (nitrogen oxide adsorption), and biasing a thin metal layer (biased flash gate). Each of these engineering solutions afford dramatic enhancement of the short wavelength response, but also suffer from serious yield variations and/or pose potential long term reliability concerns. They are particularly compromised by open face operation of the CCD in modest vacuum and at reduced temperatures (on the order of −100° C.). A quantum effiency of about 20% in the UV range is obtained by adding an organic molecular chromophore (phosphor) on the CCD. There remain some reliability, radiation damage and compatibility issues for long term space applications of these devices.

A commercially available solution is the introduction via ion implantation of a p+ layer at the silicon surface to bend the semiconductor energy bands upward and screen the effects of the fixed charge in the native oxide. This approach is the method of choice for detectors which are already in production for commercial CCD vendors such as Tektronix and Thomson CSF. The backside well, though reduced in extent by the ion implanted dopants, is still present due to the difficulty of getting a sharp doping profile by implanting and annealing the surface. Furthermore, damage caused by ion implantation reduces the quantum efficiency even after annealing.

The limited improvements achieved by the foregoing ion implantation techniques are compared in FIG. 3, illustrating the calculated spatial dependence of the conduction band edge near the backside surface of a CCD resulting from the various techniques. The curve for 200 Å of $5 \times 10^{18}$ B/cm$^3$ corresponds to the current state-of-the-art for ion implantation technology. The curve for 100 Å of $5 \times 10^{19}$ B/cm$^3$ corresponds to the ideal best that ion implantation with annealing could ultimately accomplish, in which case the vertical extent of the potential well is reduced to 50 Å—still greater than the absorption depth of UV photons, unfortunately. The curve for 50 Å of $3 \times 10^{20}$ B/cm$^3$ represents a typical dopant level for a MBE growth of a uniformly doped layer on the backside surface of the CCD. This latter technique, conceived by us, narrows the surface potential well to about 30 Å (as shown in FIG. 3), which is about half the absorption depth of UV photons, a significant improvement but not necessarily a perfect solution.

Thus, there has appeared to be no way in which to generally prevent the annihilation of a significant fraction of UV-generated electrons at the backside surface.

SUMMARY OF THE INVENTION

The backside surface potential well of a backside-illuminated CCD is confined to within less than a nanometer of the surface by using molecular beam epitaxy (MBE) to grow a delta-doped silicon layer on the backsurface. Delta-doping in MBE is achieved by temporarily interrupting the silicon flux during MBE growth without interrupting the p+ dopant (e.g., boron) flux. This produces an extremely sharp dopant profile in which the dopant is confined to only a few atomic layers, creating a sufficiently intense electric field to confine the backside surface potential well to within half a nanometer of the surface. Because the probability of UV-generated electrons being trapped by such a narrow potential well is low, the internal quantum efficiency of the CCD is nearly 100% across the UV wavelength range. Furthermore, the quantum efficiency is quite stable.

The growth of well-controlled epitaxial thin films by molecular beam epitaxy on the backside of preprocessed CCDs would not have been technically feasible until recently. This approach is now possible because of two recent developments which markedly lower the maximum MBE processing temperature. The first of these is the development by the Jet Propulsion Laboratory of a low-temperature substrate cleaning technology in which atomically clean silicon surfaces can be prepared at temperatures as low as about 200° C. Adaptation of the JPL low-temperature cleaning technology for silicon wafers to the cleaning of backside thinned CCDs is straightforward and is described below in this specification. Previous cleaning technologies for MBE have required temperatures in excess of 800° C. The second development is the commercial availability of high-temperature Knudsen cells for the evaporation of elemental boron. Use of this cell provides the capability to grow highly p-doped epitaxial layers of silicon at temperatures below 450° C. Previously, p-type doping in silicon MBE was obtained by the evaporation of compound sources such as $B_2O_3$ and $HBO_2$ and required temperatures in excess of about 550° C. to avoid incorporation of oxygen into the growing silicon layers.

DETAILED DESCRIPTION OF THE INVENTION

Figure 1:
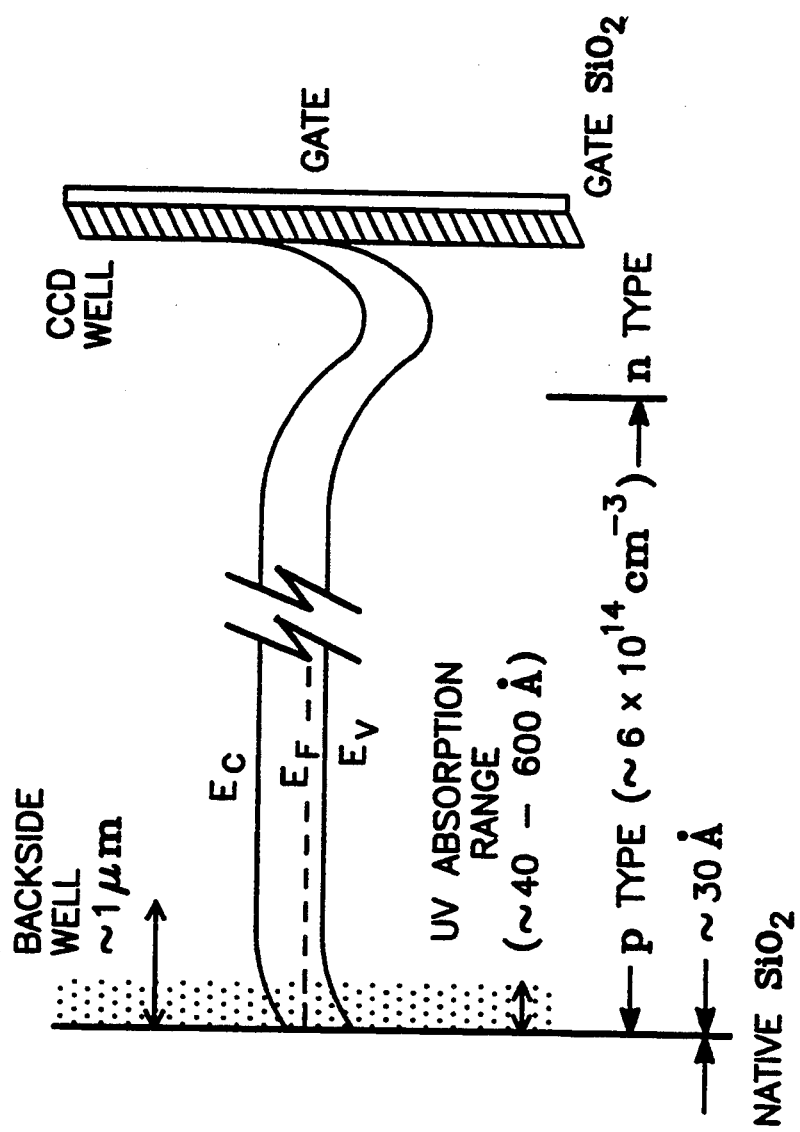
FIG. 1 illustrates the energy bands of an untreated crystalline silicon substrate near the back surface of a backside-illuminated CCD.
Figure 2:
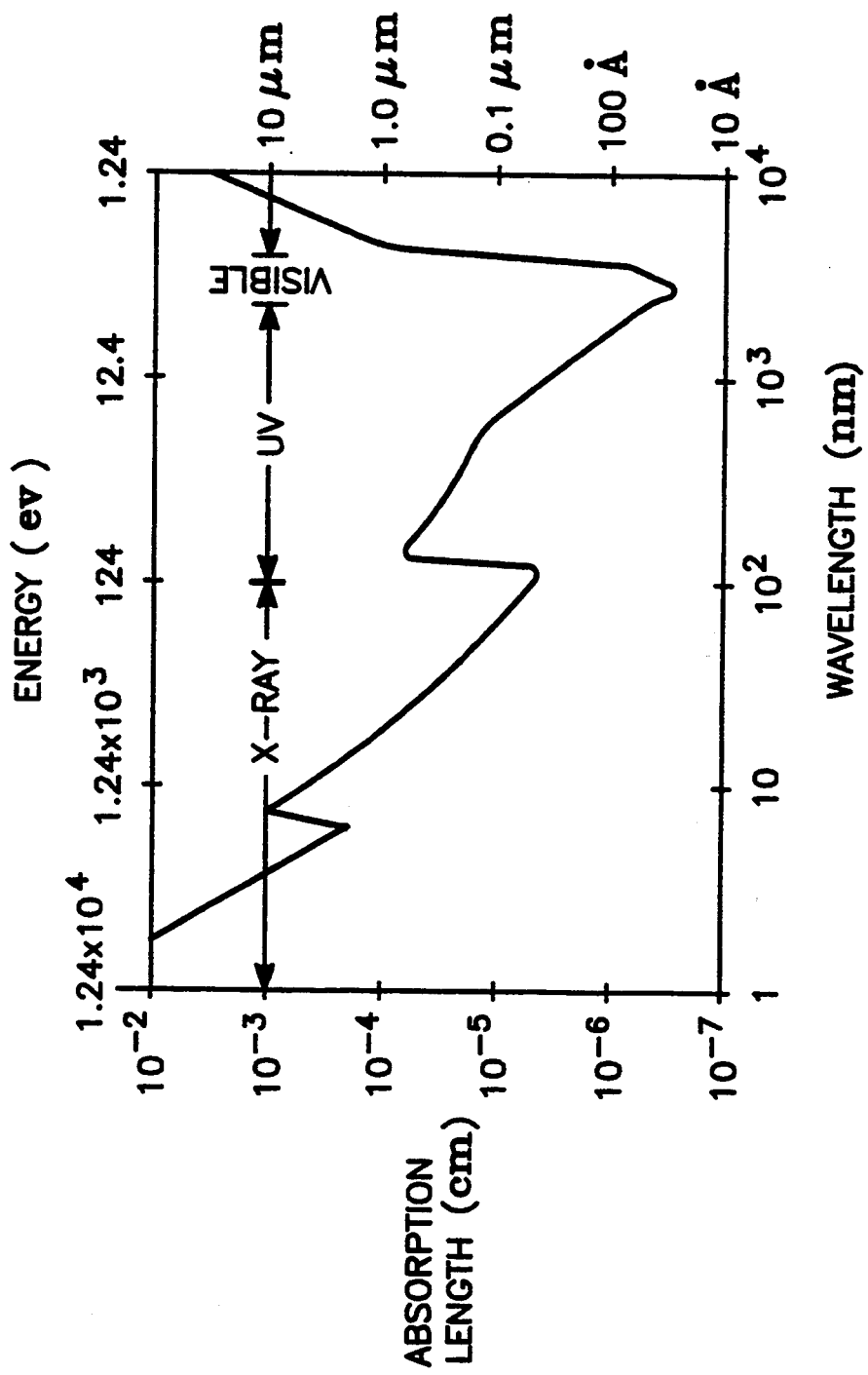
FIG. 2 is a graph illustrating the absorption depth at which incoming photons produce carriers in crystalline silicon as a function of photon wavelength.

We have used low temperature silicon molecular beam epitaxy (MBE) to grow a delta-doped (δ-doped) silicon layer on a fully processed charge-coupled device (CCD). The measured quantum efficiency of the δ-doped backside-thinned CCD is in agreement with the reflection limit for light incident on the back surface in the spectral range of 260–600 nm. The 2.5 nm silicon layer, grown at 450° C., contained a boron delta-doped layer (δ-layer) with surface density $\sim 2 \times 10^{14}$ cm$^{-2}$. Passivation of the surface was done by steam oxidation of a nominally undoped 1.5 nm Si cap layer. The UV quantum efficiency was found to be uniform and stable with respect to thermal cycling and illumination conditions.

Molecular beam epitaxy (MBE) on preprocessed electronic devices promises a significant enhancement of process capability in semiconductor device fabrication. The nanometer-scale dopant profiles of the invention, not accessible with ion implantation or diffusion processes, expand the range of devices available for integrated circuit design, as well as enhance the performance of existing devices. Progress in the areas of low-temperature epitaxial growth and low-temperature substrate cleaning has only recently opened the potential for epitaxial growth on substrates with preprocessed devices. In particular, doped Si homoepitaxial layers of good electrical quality can be grown by MBE at temperatures as low as 325° C. for layer thicknesses up to 150 nm. In addition, the conventional high-temperature substrate cleaning steps, which usually exceed 750° C., can be replaced with the low-temperature preparation of hydrogen-terminated substrates, which can be produced atomically clean at temperatures as low as ~200° C.

Epitaxial growth can commence on H-terminated Si (100) surfaces at temperatures as low as 370° C. Such surfaces are disclosed in Grunthaner et al., "Hydrogen-Terminated Silicon Substrates for Low-Temperature Molecular Beam Epitaxy," *Thin Solid Films*, Vol. 183 (1989), pages 197-212. The present invention uses low-temperature MBE to achieve nearly ideal ultraviolet response of a silicon, backside-thinned charge-coupled device (CCD). The invention forms delta-doped layers using delta-doping MBE techniques of the type described in Jorke et al., "Boron delta doping in Si and $Si_{0.8}Ge_{0.2}$ layers," *Applied Physics Letters*, Vol. 57, No. 17, Oct. 22, 1990, pages 1763-1765 and Mattey et al., "p-type delta doped layers in silicon: Structural and Electronic Properties," *Applied Physics Letters*, Vol. 57, No. 16, Oct. 15, 1990, pages 1648-1650.

An epitaxial δ-doped Si layer was grown on a backside thinned fully functional Reticon CCD prior to the final packaging step. With the growth of 2.5 nm of δ-doped silicon, the ultraviolet quantum efficiency of a Reticon CCD was increased from essentially zero to near the limit imposed by reflection from the silicon surface. During processing of the device and growth of the silicon layer, the temperature of the CCD did not exceed 450° C., thus avoiding thermal damage to the Al metallization on the CCD front surface.

Si MBE offers a permanent, stable solution to the problem of the backside potential well. Other than ion implantation, Si MBE is the only permanent solution which leaves the silicon surface essentially bare, with a native oxide and reflection the sole barriers to UV photons. Unlike ion implantation, Si MBE technology enables the introduction of atomically abrupt, high-dopant-concentration profiles. Furthermore, ion implantation suffers from a high surface recombination velocity which limits the UV quantum efficiency.

Figure 3:
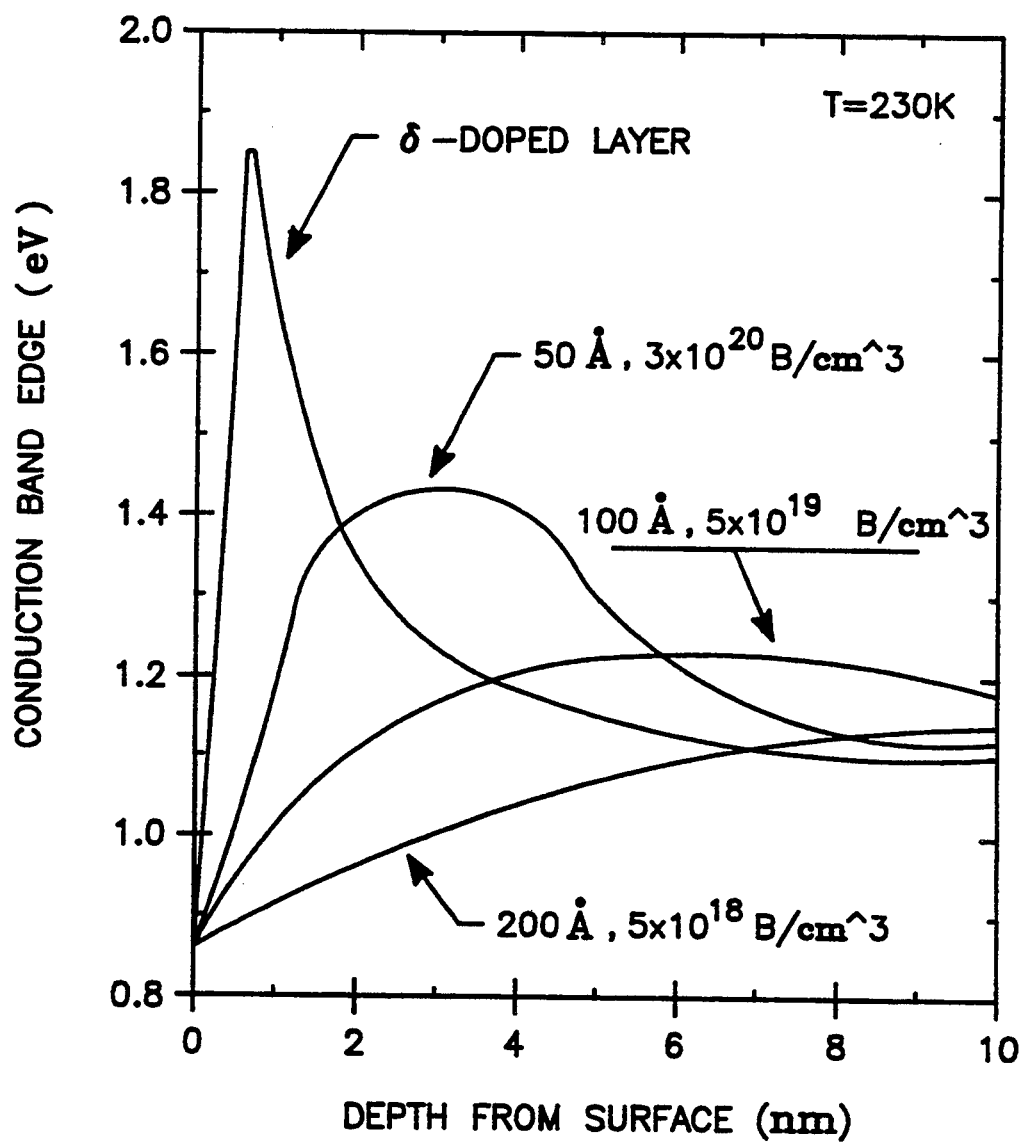
FIG. 3 illustrates the calculated energy bands of crystalline silicon with various p+ layers at the surface.

The curve labelled "δ-doped layer" in FIG. 3 corresponds to the results achieved by the invention, in which MBE has been used to place dopant atoms nominally in a single monolayer of the epitaxially grown crystal layer, reducing the width of the backside well to less than 1 nm. Data presented in this specification indicate that the remaining backside well has a negligible effect on the quantum efficiency of a CCD with a δ-doped layer.

Our experiments utilized an E G & G Reticon RA0512J 512×512 element CCD die with 27 μm square pixels. The active area is square, approximately 0.6 inches wide. Chemical thinning, using a Cr/Au etch mask, reduced the thickness of the active area of the CCD to approximately 15 μm for backside illumination. The CCD membrane was supported by a gold-coated frame ~0.05 cm thick and ~0.3 cm wide and is recessed from the frame by 500 μm. In order to avoid contamination of the MBE growth chamber, the gold was chemically removed from the frame prior to MBE growth. Using Apiezon W wax, the CCD die was bonded to a sapphire substrate for protection of the sensitive gate structures and bonding pads. Gold was etched from the frame by spinning the CCD at 6000 rpm and depositing gold etchant at a rate of ~80 ml/h onto the membrane, thus avoiding exposure of the membrane to gold-laden materials or solution. The gold etchant consisted of $N(C_2H_5)_4I_{2n+1}$ dissolved in 1:1:2 $H_2O$:acetonitrile:ethanol. The CCD was rinsed by spinning 8:1:1 ethanol:HCl:$H_2O$ and 10:1 ethanol:$H_2O$ sequentially onto the membrane. The thinned Si membrane was subsequently cleaned using solutions of 4:1:1 $H_2O$:HCl:$H_2O_2$, 1:10 HF:$H_2O$, 3:1:5 $NH_2OH$:$H_2O_2$:$H_2O$, and DI $H_2O$. The CCD was separated from the sapphire substrate by dissolution of the wax in 70° C. trichloroethylene, and immersed sequentially in 60° C. xylene, Nophenol 922, isopropyl alcohol, xlyene, and Transene 100. A 10 min exposure to UV-generated ozone, shown by X-ray photoemission spectroscopy to significantly reduce carbon contamination, completed the organic clean. Under a nitrogen ambient environment, a 1:5 HF:ethanol solution was applied to the silicon membrane while spinning, forming a hydrogen-terminated silicon surface.

Epitaxial silicon growth was performed in a commercial Riber EVA 32 Si MBE system with a base pressure of $3 \times 10^{-11}$ Torr. During transferral and growth in the MBE chamber, the CCD was mounted in a holder fabricated from micromachined silicon which is the subject of co-pending U.S. patent application Ser. No. 07/905,018 filed Jun. 26, 1992, by Michael E. Hoenk, Paula J. Grunthaner and Frank J. Grunthaner entitled "SILICON SAMPLE HOLDER FOR MOLECULAR BEAM EPITAXY ON PREFABRICATED INTEGRATED CIRCUITS" and assigned to the present assignee, the disclosure of which is incorporated herein by reference. Ramping of the substrate temperature to the 450° C. growth temperature was done in stages to permit outgassing of etch residues left on the surface by the H-termination step. The pressure during growth was approximately $6 \times 10^{-10}$ Torr. Boron was supplied from an elemental source, heated in a high-temperature Knudsen cell.

Figure 5:
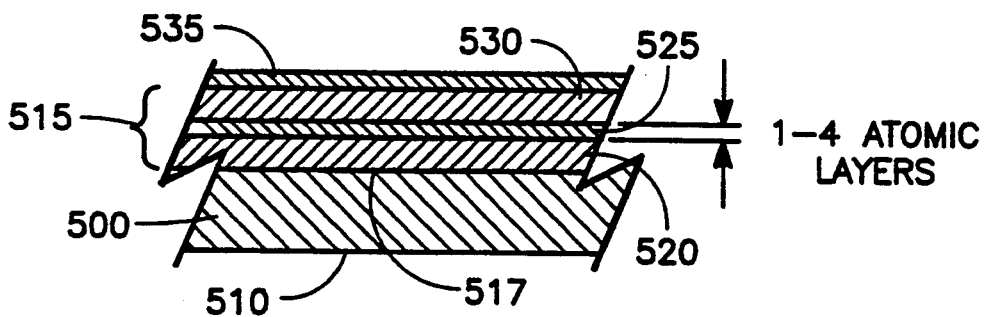
FIG. 5 is a simplified cross-sectional view of a CCD imaging device embodying the present invention.

For growth at 450° C., boron concentration profiles have been reported to be abrupt on a scale smaller than 2 nm/decade, which is the resolution limit of SIMS. At high surface coverage, stable surface phases of boron on silicon have been observed, indicating the possibility of growing silicon with buried boron δ-layers which are abrupt on an atomic scale. The growth consisted of a 1 nm silicon buffer layer, doped with $4 \times 10^{20}$ B/$cm^3$, a δ-layer containing $-2 \times 10^{14}$ B/$cm^2$ deposited during a 100 s interruption of the silicon flux, and a 1.5 nm cap layer of nominally undoped silicon. The resulting structure is illustrated in FIG. 5. The silicon deposition rate used was 0.05 nm/s. The exposure of the gate oxide to Si $K_\alpha$ X-rays from the Si source, estimated to be ~5 krad ($SiO_2$), is well within acceptable levels for Reticon CCDs. Following the growth, the CCD was exposed to steam from boiling DI $H_2O$ for 30 min to form a protective oxide on the back surface. The 1.5 nm cap layer is sufficient to prevent oxidation of the δ-layer.

Testing of the CCD was performed upon completion of the foregoing. Illuminating the CCD back surface with a Xenon lamp, the incident wavelength was varied with a monochromator and bandpass filters. The incident photon flux was measured with a calibrated photodiode. With the exception of a few percent of the pixels, flat-field measurements show a uniformly high UV quantum efficiency (QE) in the 512×512 element CCD. During two weeks of testing, the device was cycled in temperature several times with no observed effect on the QE. The illumination history had no effect on the measured UV QE.

Figure 4:
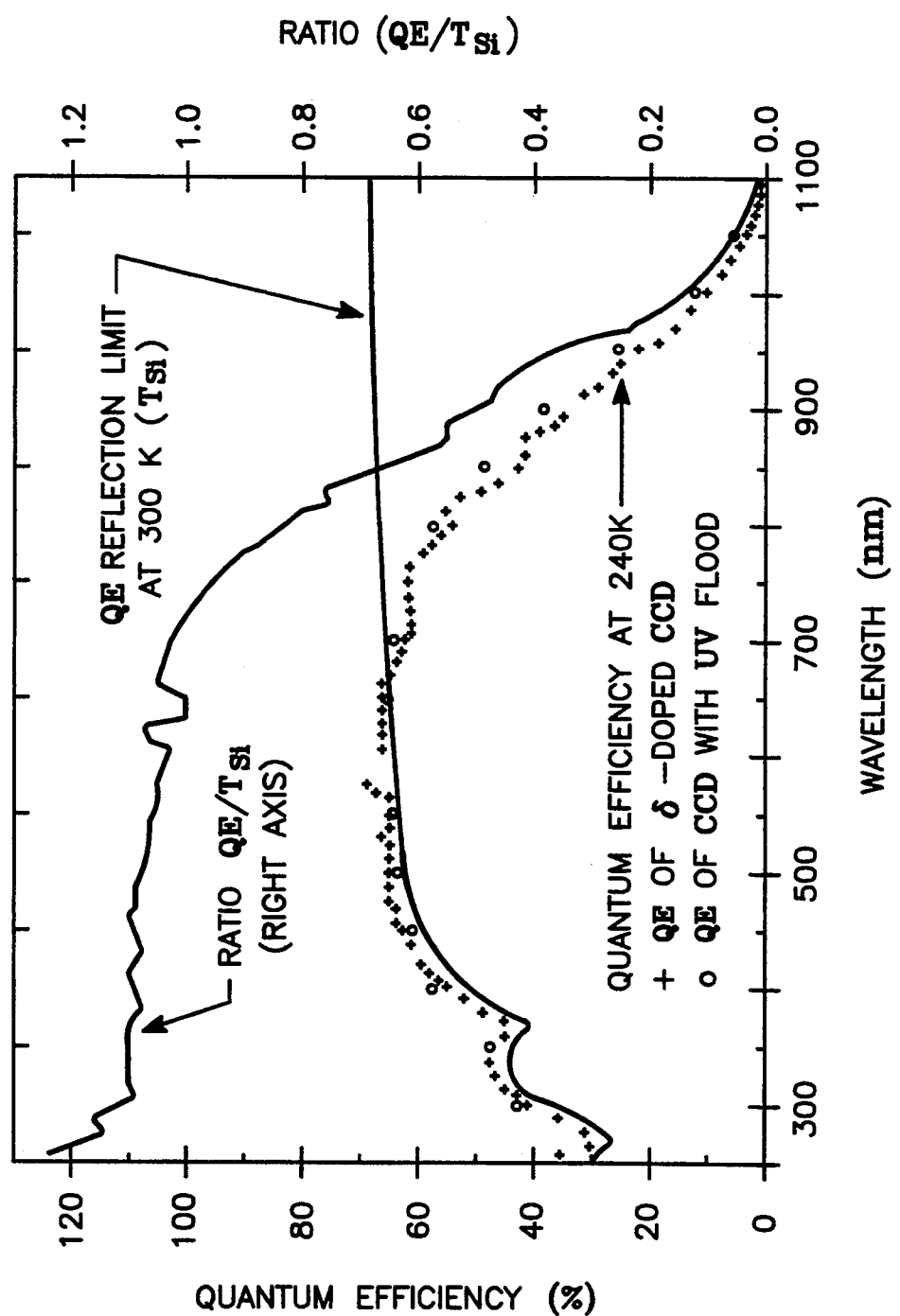
FIG. 4 is a graph of the measured quantum efficiency as a function of wavelength of a CCD fabricated in accordance with the invention compared with that of a CCD immediately following a UV flood procedure.

The spectral quantum efficiency at 240° K. of the δ-doped CCD, averaged over a 100×100 pixel area, is plotted in FIG. 4 as a series of "+" symbols. The minimum QE of the δ-doped CCD is about 30% at 270 nm, compared with zero for an untreated CCD at this wavelength. For comparison, the QE reflection limit and the measured QE of a high-quality, UV-flooded Reticon CCD are plotted in FIG. 4 as a solid line and a series of "0" symbols, respectively. A UV flood temporarily bestows reflection-limited UV response to an unmodified CCD. The δ-doped CCD exhibits the same spectral QE as the UV-flooded CCD, which is a benchmark test for reflection-limited response. The Si transmittance was calculated assuming normal incidence, based on tabulated optical constants of bare silicon at room temperature.

Ellipsometry measurements of the optical properties of highly-doped bulk Si relative to undoped Si show only a slight broadening and red shift of the E1 and E2 transitions in the near ultraviolet, indicating that a thin, highly-doped MBE silicon layer should have negligible effect on the UV reflectance of the CCD back surface. This is confirmed by the agreement between the quantum efficiencies of the δ-doped and UV-flood CCDs, and by the agreement with the room-temperature Si transmittance. The E1 and E2 transitions at 3.4 and 4.25 eV, respectively, are broadened and shifted slightly with increasing temperature, which may have a small effect on the comparison of the CCD data with room-temperature optical constants of silicon. In particular, the silicon transmittance may be slightly higher at 240° K. than at 300° K. in the long-wavelength tail of the E1 transition.

The ratio between the quantum efficiency and the silicon transmittance, $QE/T_{Si}$, is also plotted in FIG. 4. Above 600 nm, the absorption length in silicon becomes sufficiently long to permit transmission of light through the membrane, corresponding to the observed decrease in the ratio, $QE/T_{Si}$, in the near infrared. From 350 nm to 600 nm, the ratio is slightly higher than one, indicating the existence of a small, systematic calibration error in the measured absolute QE. We attribute this to error in the measurement of the source intensity with the calibrated photodiode. At photon energies higher than 3.5 eV, the quantum yield of silicon is larger than unity, resulting in an increase in the internal QE above 100% for wavelengths shorter than 360 nm. Adding to this effect, the high electric field associated with the δ-layer may increase impact ionization for hot electrons produced close to the back surface. We observe an increase in the ratio, $QE/T_{Si}$, which agrees with the reported quantum yield of silicon. The agreement between the measured quantum efficiency of the δ-doped CCD and the silicon transmittance is very good in the spectral range 260–600 nm. While we cannot measure the quantum efficiency at shorter wavelengths with our apparatus, the absorption length minimum and the maximum reflectance occur at a wavelength of ~280 nm in silicon, indicating that the growth of a δ-layer on the CCD gives nearly reflection-limited response throughout the UV spectrum.

Referring to FIG. 5, a CCD imaging chip improved in accordance with the foregoing process includes the original CCD silicon substrate 500 which has been thinned as described above, with CCD circuit elements formed on its front surface 510 and an epitaxial silicon layer 515 grown on its back surface 517. The epitaxial silicon layer 515 includes a base epitaxial silicon layer 520 whose bottom is in epitaxial crytalline registration with the back surface 517 of the substrate 500 and whose top few atomic layers 525 are heavily doped with a p-type dopant such as Boron, a top epitaxial silicon layer 530 overlying the base layer 520 and a passivating oxide layer 535 overlying the top epitaxial layer 530.

While the invention has been described in detail by specific reference to preferred embodiments thereof, it is understood that variations and modifications thereof may be made without departing from the true spirit and scope of the invention.

What is claimed is:

1. An integrated circuit comprising:
   a planar crystalline semiconductor substrate having front and back surfaces with micro-electronic circuit elements formed at said front surface;
   a delta-doped epitaxial semiconductor layer grown on said back surface after fabrication of said micro-electronic circuit elements on said front surface, wherein said delta-doped epitaxial semiconductor layer comprises a high concentration of dopant impurities which are generally confined within a layer therein of approximately 1 to 4 atoms thick, and wherein remaining portions of said epitaxial semiconductor layer have a dopant concentration substantially less than said high concentration.

2. The integrated circuit of claim 1 wherein said micro-electronic circuit elements comprise CCD imaging circuit elements.

3. An integrated circuit formed by a process comprising:
   forming a complete micro-electronic circuit on a front surface of a semiconductor substrate;
   growing a delta-doped epitaxial semiconductor layer by molecular beam epitaxy on a back surface of said substrate without damaging said micro-electronic circuit elements, wherein said delta-doped epitaxial semiconductor layer comprises a high concentration of dopant impurities which are generally, confined within a layer therein of approximately 1 to 4 atoms thick, and wherein remaining portions of said epitaxial semiconductor layer have a dopant concentration substantially less than said high concentration.

4. The integrated circuit formed by the process of claim 3 wherein said growing is preceded by atomically cleaning said surface at a temperature at which said micro-electronic circuit elements are not damaged.

5. The integrated circuit formed by the process of claim 3 wherein said growing comprises:
   exposing said surface to a source of evaporated semiconductor atoms whereby to grow an epitaxial layer of crystalline semiconductor on said surface up to a first thickness;
   shielding said surface from said source of evaporated semiconductor material while exposing said surface to a source of evaporated semiconductor dopant atoms whereby to heavily dope said first thickness of epitaxial layer with said dopant atoms;
   re-exposing said surface to said source of evaporated semiconductor atoms whereby to further grow said epitaxial layer of crystalline semiconductor on said surface up to a second thickness greater than said first thickness.

* * * * *